United States Patent
Enya et al.

(10) Patent No.: US 11,959,326 B2
(45) Date of Patent: Apr. 16, 2024

(54) VEHICLE OPERATION DETECTION DEVICE AND VEHICLE OPERATION DETECTION METHOD

(71) Applicants: AISIN CORPORATION, Kariya (JP); HONDA MOTOR CO., LTD., Tokyo (JP)

(72) Inventors: Kenta Enya, Kariya (JP); Takashi Kaino, Kariya (JP); Shiho Nakayama, Kariya (JP); Ryo Asami, Kariya (JP); Toshihiro Kaneda, Tokyo (JP); Kenichiro Kagawa, Tokyo (JP)

(73) Assignee: AISIN CORPORATION, Kariya (JP)

( * ) Notice: Subject to any disclaimer, the term of this patent is extended or adjusted under 35 U.S.C. 154(b) by 142 days.

(21) Appl. No.: 17/495,472

(22) Filed: Oct. 6, 2021

(65) Prior Publication Data

US 2022/0106826 A1    Apr. 7, 2022

(30) Foreign Application Priority Data

Oct. 7, 2020    (JP) .................................. 2020-169940

(51) Int. Cl.
*E05F 15/00* (2015.01)
*E05B 81/56* (2014.01)
(Continued)

(52) U.S. Cl.
CPC .............. *E05F 15/73* (2015.01); *E05B 81/56* (2013.01); *E05B 81/78* (2013.01); *H03K 17/955* (2013.01);
(Continued)

(58) Field of Classification Search
CPC . E05F 15/00; E05F 15/44; E05F 15/46; E05F 15/73; E05B 81/54; E05B 81/56;
(Continued)

(56) References Cited

U.S. PATENT DOCUMENTS 11,120,655 B1 * 9/2021 Huggins .................. G07C 9/00
11,628,803 B2 * 4/2023 Park ........................ E05F 15/72
701/49

(Continued)

FOREIGN PATENT DOCUMENTS

JP        2018081013 A    5/2018
JP        2019071246 A    5/2019

*Primary Examiner* — Chi Q Nguyen
(74) *Attorney, Agent, or Firm* — BUCHANAN INGERSOLL & ROONEY PC

(57) ABSTRACT

A vehicle operation detection device includes processing circuitry configured to output a command causing an opening-closing body of a vehicle to open and close in reference to capacitances of sensor electrodes arranged so as to form a row. The processing circuitry is configured to determine that a first operation has been performed when one of the sensor electrodes of which the capacitance increases is sequentially shifted in a first direction from an operation start electrode and determine that a second operation has been performed when the shifting is performed in a second direction. The sensor electrodes include an adjacent electrode adjacent to the operation start electrode. The processing circuitry is configured to determine that the capacitance of the adjacent electrode has increased when the capacitance becomes greater than or equal to a second determination value that is greater than a first determination value.

11 Claims, 5 Drawing Sheets

(51) Int. Cl.
*E05B 81/78* (2014.01)
*E05F 15/73* (2015.01)
*H03K 17/955* (2006.01)

(52) U.S. Cl.
CPC ....... *E05Y 2400/40* (2013.01); *E05Y 2400/44* (2013.01); *E05Y 2400/86* (2013.01); *E05Y 2900/531* (2013.01)

(58) Field of Classification Search
CPC .......... E05B 81/60; E05B 81/78; E05B 81/86; E05B 81/88; E05Y 2400/40; E05Y 2400/44; E05Y 2400/852; E05Y 2400/856; E05Y 2400/86; E05Y 2900/531; H05K 17/955
See application file for complete search history.

(56) References Cited

U.S. PATENT DOCUMENTS

| | | | |
|---|---|---|---|
| 2018/0135339 A1 | 5/2018 | Kubo | |
| 2020/0115951 A1* | 4/2020 | Naserian | E05F 15/73 |
| 2021/0263591 A1* | 8/2021 | Bensalem | E05F 15/665 |
| 2022/0106826 A1* | 4/2022 | Enya | H03K 17/955 |
| 2022/0205306 A1* | 6/2022 | Yamauchi | E05F 15/40 |
| 2022/0243517 A1* | 8/2022 | Liu | E05F 15/646 |
| 2022/0290484 A1* | 9/2022 | Salter | B60J 5/047 |
| 2022/0307297 A1* | 9/2022 | Umezawa | E05B 83/04 |
| 2022/0316260 A1* | 10/2022 | Tao | E05F 15/73 |
| 2023/0065657 A1* | 3/2023 | Weston | E05F 15/43 |
| 2023/0085770 A1* | 3/2023 | Jang | E05F 15/70 49/324 |
| 2023/0089000 A1* | 3/2023 | Peterson | B60R 25/2045 343/711 |

* cited by examiner

VEHICLE OPERATION DETECTION DEVICE AND VEHICLE OPERATION DETECTION METHOD

BACKGROUND

1. Field

The present disclosure relates to a vehicle operation detection device and a vehicle operation detection method.

2. Description of Related Art

A typical vehicle operation detection device detects a hand motion of a user so as to cause a sliding door to open and close. Japanese Laid-Open Patent Publication No. 2019-71246 discloses an example of a vehicle operation detection device that includes sensor electrodes and a control circuit. In each of the sensor electrodes, the capacitance changes in correspondence with the distance from a detection target. The control circuit refers to the capacitance to drive an actuator, thereby causing the sliding door to open and close.

The vehicle operation detection device outputs a signal used to open the sliding door when one of the sensor electrodes that indicates a change in the capacitance is sequentially shifted in a opening direction of the sliding door. The vehicle operation detection device outputs a signal used to close the sliding door when one of the sensor electrodes that indicates a change in the capacitance is sequentially shifted in a closing direction of the sliding door.

SUMMARY

In the above-described vehicle operation detection device, there is room for improvement in increasing the accuracy of detecting an operation performed by the user. It is an objective of the present disclosure to provide a vehicle operation detection device and a vehicle operation detection method capable of increasing the accuracy of detecting an operation performed by the user.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An aspect of the present disclosure provides a vehicle operation detection device. The vehicle operation detection device includes sensor electrodes arranged so as to form a row and configured such that a capacitance of each of the sensor electrodes increases as a detection target approaches the respective sensor electrode and processing circuitry configured to output a command that causes an opening-closing body of a vehicle to open and close in reference to the capacitances of the sensor electrodes. An arrangement direction of the sensor electrodes includes a first direction corresponding to an opening direction of the opening-closing body and a second direction corresponding to a closing direction of the opening-closing body. The sensor electrodes include two sensor electrodes at leading ends in the first direction and the second direction, respectively. The processing circuitry is configured to execute a start electrode determination process that defines, as an operation start electrode, one of the two sensor electrodes of which the capacitance is greater than or equal to a first determination value, an operation determination process that determines whether the capacitance of one of the sensor electrodes increases, the operation determination process determining that a first operation has been performed in a case where the one of the sensor electrodes of which the capacitance increases is sequentially shifted in the first direction from the operation start electrode, the operation determination process determining that a second operation has been performed in a case where the one of the sensor electrodes of which the capacitance increases is sequentially shifted in the second direction from the operation start electrode, and a command process that outputs a command that causes the opening-closing body to open when the first operation is determined as having been performed and outputs a command that causes the opening-closing body to close when the second operation is determined as having been performed. The sensor electrodes include an adjacent electrode that is adjacent to the operation start electrode. The operation determination process includes determining that a capacitance of the adjacent electrode has increased in a case where the capacitance of the adjacent electrode becomes greater than or equal to a second determination value, the second determination value being greater than the first determination value.

The sensor electrodes are adjacent to each other. Thus, an increase may occur in the capacitance of the sensor electrode serving as the adjacent electrode as well as the capacitance of the sensor electrode serving as the operation start electrode when the user moves a hand or the like toward the sensor electrode serving as the operation start electrode to perform the first operation or the second operation.

In a comparative example, it is assumed that a small determination value is used to determine an increase in the capacitance of the adjacent electrode. In this comparative example, the capacitance of the adjacent electrode may become greater than or equal to the determination value prior to the point in time when the operation start electrode is defined. In this case, subsequent to the point in time when the operation start electrode is defined, the capacitance of the adjacent electrode does not become greater than or equal to the determination value. Thus, the sensor electrode of which the capacitance increases is not sequentially shifted in the first direction or the second direction. Accordingly, the operation detection device of the comparative example may be unable to correctly detecting that the first operation or the second operation has been performed.

The above-described operation detection determines that the capacitance of the adjacent electrode has increased when the capacitance of the adjacent electrode is greater than or equal to the second determination value, which is greater than the first determination value. That is, the sensor electrode of which the capacitance increases is easily switched sequentially in the first direction or the second direction. Thus, the operation detection device is capable of increasing the accuracy of detecting an operation performed by the user.

A further aspect of the present disclosure provides a vehicle operation detection device. The vehicle operation detection device includes sensor electrodes arranged so as to form a row and configured such that a capacitance of each of the sensor electrodes increases as a detection target approaches the respective sensor electrode and processing circuitry configured to output a command that causes an opening-closing body of a vehicle to open and close in reference to the capacitances of the sensor electrodes. An arrangement direction of the sensor electrodes includes a first direction corresponding to an opening direction of the opening-closing body and a second direction corresponding to a closing direction of the opening-closing body. The sensor electrodes include two sensor electrodes at leading ends in the first direction and the second direction, respectively. The processing circuitry is configured to execute a start electrode determination process that defines, as an operation start electrode, one of the two sensor electrodes of which the capacitance is greater than or equal to a first determination value, an operation determination process that determines whether the capacitance of one of the sensor electrodes increases, the operation determination process determining that a first operation has been performed in a case where the one of the sensor electrodes of which the capacitance increases is sequentially shifted in the first direction from the operation start electrode, the operation determination process determining that a second operation has been performed in a case where the one of the sensor electrodes of which the capacitance increases is sequentially shifted in the second direction from the operation start electrode, and a command process that outputs a command that causes the opening-closing body to open when the first operation is determined as having been performed and outputs a command that causes the opening-closing body to close when the second operation is determined as having been performed. The sensor electrodes include an adjacent electrode that is adjacent to the operation start electrode. The operation determination process includes determining that a capacitance of the adjacent electrode has increased in a case where the capacitance of the adjacent electrode becomes greater than or equal to a second determination value. The start electrode determination process includes defining, as the operation start electrode, one of the two sensor electrodes of which the capacitance remains greater than or equal to the first determination value over a determination time. The operation determination process includes setting the second determination value to be greater than the first determination value in a case where the capacitance of the adjacent electrode at a point in time when the operation start electrode is defined is greater than or equal to the first determination value and setting the second determination value to be equal to the first determination value in a case where the capacitance of the adjacent electrode at the point in time when the operation start electrode is defined is less than the first determination value.

Another aspect of the present disclosure provides a vehicle operation detection method. The vehicle operation detection method detects an operation for causing an opening-closing body of a vehicle to open and close using sensor electrodes arranged so as to form a row. An arrangement direction of the sensor electrodes includes a first direction corresponding to an opening direction of the opening-closing body and a second direction corresponding to a closing direction of the opening-closing body. The sensor electrodes include two sensor electrodes at leading ends in the first direction and the second direction. The vehicle operation detection method includes defining, as an operation start electrode, one of the two sensor electrodes of which the capacitance is greater than or equal to a first determination value, determining whether the capacitance of one of the sensor electrodes increases, the determining including determining that a first operation has been performed in a case where the one of the sensor electrodes of which the capacitance increases is sequentially shifted in the first direction from the operation start electrode and determining that a second operation has been performed in a case where the one of the sensor electrodes of which the capacitance increases is sequentially shifted in the second direction from the operation start electrode, and outputting a command that causes the opening-closing body to open when the first operation is determined as having been performed and outputting a command that causes the opening-closing body to close when the second operation is determined as having been performed. The sensor electrodes include an adjacent electrode that is adjacent to the operation start electrode. The determining whether the capacitance of the one of the sensor electrodes increases includes determining that a capacitance of the adjacent electrode has increased in a case where the capacitance of the adjacent electrode becomes greater than or equal to a second determination value, the second determination value being greater than the first determination value.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

First Embodiment

A vehicle operation detection device 80 (hereinafter also referred to as the operation detection device 80) according to a first embodiment will now be described with reference to the drawings.

Figure 1:
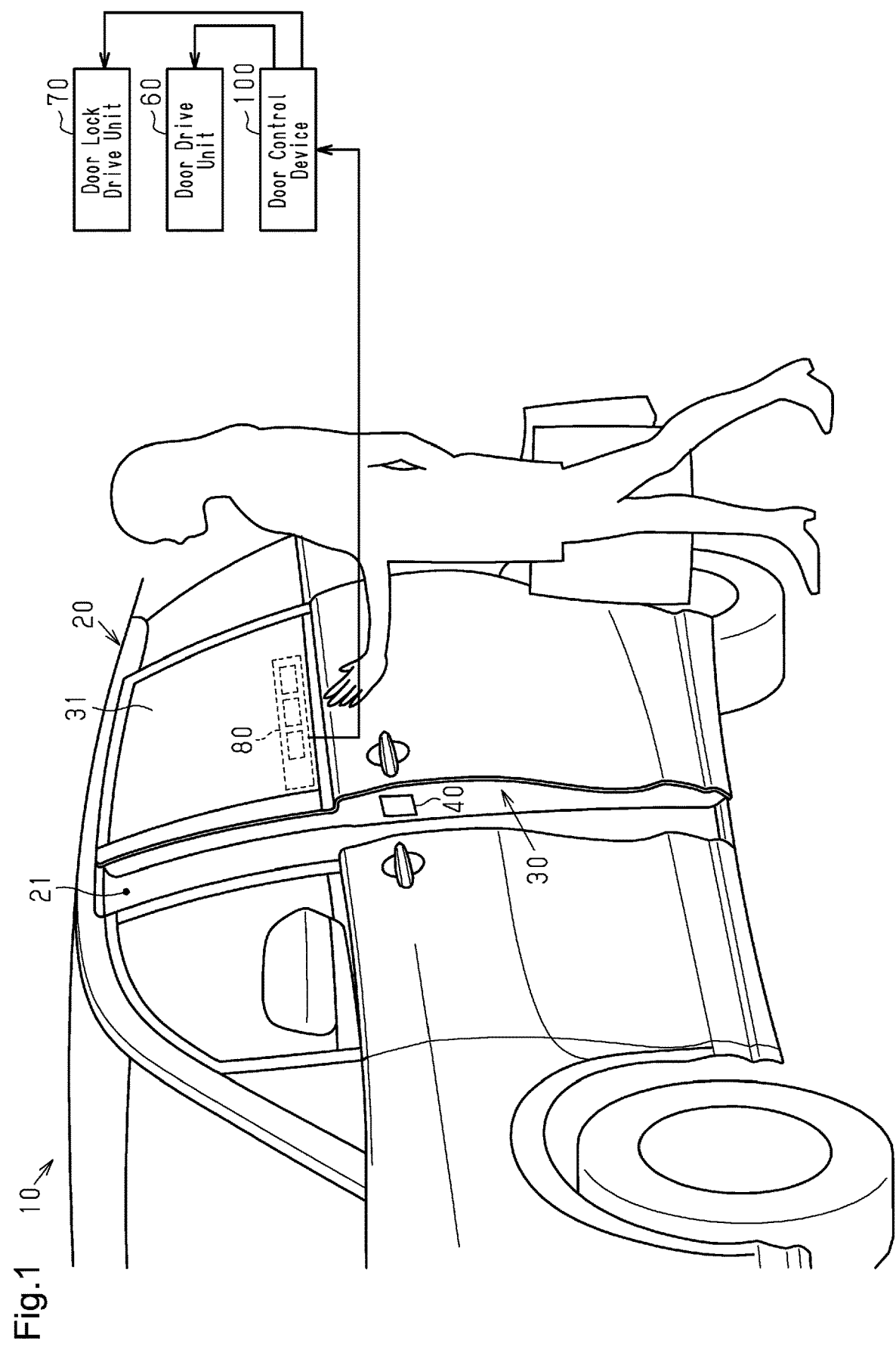
FIG. 1 is a schematic diagram showing a vehicle that includes a vehicle operation detection device according to a first embodiment.

As shown in FIG. 1, a vehicle 10 includes a vehicle body 20, a sliding vehicle door 30, and a door lock 40. The vehicle body 20 includes a door opening 21 at a side part of the vehicle 10. The vehicle door 30 opens and closes the door opening 21. The door lock 40 locks the vehicle door 30 on the vehicle body 20. The vehicle 10 further includes a door drive unit 60, a door lock drive unit 70, the operation detection device 80, and a door control device 100. The door drive unit 60 drives the vehicle door 30. The door lock drive unit 70 drives the door lock 40. The operation detection device 80 detects an operation performed by the user to open and close the vehicle door 30. The door control device 100 controls the door drive unit 60 and the door lock drive unit 70.

The vehicle door 30 is actuated between a fully-closed position at which the door opening 21 is fully closed and a fully-open position at which the door opening 21 is fully open. In the first embodiment, the direction in which the vehicle door 30 moves from the fully-closed position toward the fully-open position is a rearward direction of the vehicle 10, and the direction in which the vehicle door 30 moves from the fully-open position toward the fully-closed position is a frontward direction of the vehicle 10.

The door drive unit 60 causes the vehicle door 30 to close toward the fully-closed position and causes the vehicle door 30 to open toward the fully-open position. The door lock 40 locks the vehicle door 30 on the vehicle body 20 at the fully-closed position and unlocks the vehicle door 30 at the fully-closed position. The door lock drive unit 70 switches the state of the door lock 40 between a locked state and an unlocked state of the vehicle door 30.

The operation detection device 80 will now be described.

The operation detection device 80 is located at a position that allows the user to operate the operation detection device 80 from the outside of the vehicle door 30. In the first embodiment, the operation detection device 80 is located on the inner side of the door trim, which is an interior component of the vehicle door 30. Further, the operation detection device 80 is located at a position that allows the user to visually recognize the operation detection device 80 through a window glass 31 of the vehicle door 30 from the outer side of the vehicle 10. In another embodiment, the operation detection device 80 may be embedded in the outer panel, which is located on the outer side of the vehicle door 30.

Figure 2:
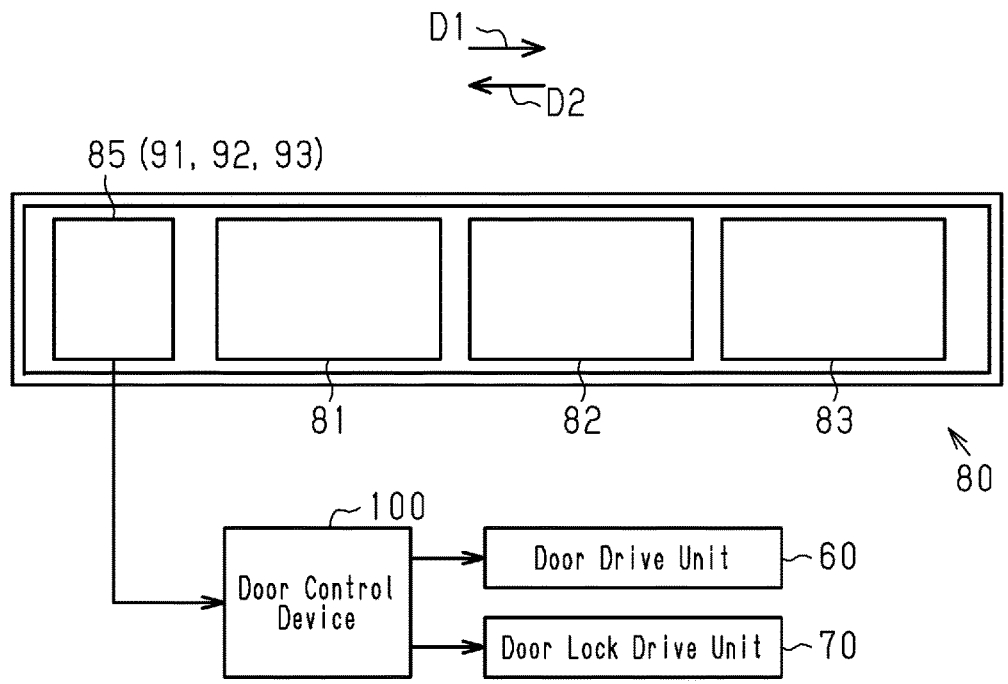
FIG. 2 is a schematic diagram showing the configuration of the vehicle operation detection device in FIG. 1.

As shown in FIG. 2, the operation detection device 80 includes a first sensor electrode 81, a second sensor electrode 82, and a third sensor electrode 83 that are separated from each other in the directions in which the vehicle door 30 opens and closes. Further, the operation detection device 80 includes a controller 85 that outputs a signal to the door control device 100 in reference to the detection results of the first sensor electrode 81, the second sensor electrode 82, and the third sensor electrode 83.

The first sensor electrode 81, the second sensor electrode 82, and the third sensor electrode 83 have the shape of a rectangular plate. The first sensor electrode 81, the second sensor electrode 82, and the third sensor electrode 83 have the same area that is orthogonal to the thickness direction. The lengths of the first sensor electrode 81, the second sensor electrode 82, and the third sensor electrode 83 in the longitudinal direction conform to a hand of the user. For example, it is preferred that the lengths of the first sensor electrode 81, the second sensor electrode 82, and the third sensor electrode 83 in the longitudinal direction be approximately 10 cm to 20 cm.

The first sensor electrode 81, the second sensor electrode 82, and the third sensor electrode 83 are arranged so as to form a row. In the first embodiment, the arrangement direction of the first sensor electrode 81, the second sensor electrode 82, and the third sensor electrode 83 coincides with the front-rear direction of the vehicle 10. More specifically, the first sensor electrode 81 is closest to the front side of the vehicle 10, the third sensor electrode 83 is closest to the rear side of the vehicle 10, and the second sensor electrode 82 is located between the first sensor electrode 81 and the third sensor electrode 83.

In the following description, in the arrangement direction of the sensor electrodes, the direction oriented from the first sensor electrode 81 toward the third sensor electrode 83 is a first direction D1 and the direction oriented from the third sensor electrode 83 toward the first sensor electrode 81 is a second direction D2. The first direction D1 corresponds to the opening direction of the vehicle door 30. The second direction D2 corresponds to the closing direction of the vehicle door 30. The first sensor electrode 81 is located at a leading end in the second direction D2. The third sensor electrode 83 is located at a leading end in the first direction D1. That is, the first sensor electrode 81 and the third sensor electrode 83 are located at the ends in the arrangement direction.

The first sensor electrode 81, the second sensor electrode 82, and the third sensor electrode 83 form a pseudocapacitor in cooperation with a detection target that has approached each sensor electrode. Thus, as the detection target becomes closer to the sensor electrode, the capacitance defined by the positional relationship between the sensor electrode and the detection target becomes larger. For the capacitance to increase when the detection target approaches the sensor electrode from the outer side of the vehicle 10, the detection range of the sensor electrode spreads outward from the vehicle 10. In the following description, the capacitance defined by the positional relationship between the sensor electrode and the detection target is also simply referred to as the capacitance of the sensor electrode.

It is assumed that the user performs an operation for holding a hand over the first sensor electrode 81 and then moving the hand in the first direction D1 as an operation for causing the vehicle door 30 to open. In the following description, the operation for shifting, in the first direction D1, the sensor electrode toward which the user moves a hand is referred to as the first operation. When the user performs the first operation, the first sensor electrode 81 serves as an operation start electrode, the second sensor electrode 82 serves as an adjacent electrode that is adjacent to the operation start electrode, and the third sensor electrode 83 serves as an operation end electrode.

It is assumed that the user performs an operation for holding a hand over the third sensor electrode 83 and then moving the hand in the second direction D2 as an operation for causing the vehicle door 30 to close. In the following description, the operation for shifting, in the second direction D2, the sensor electrode toward which the user moves a hand in the sensor electrodes is referred to as the second operation. When the user performs the second operation, the third sensor electrode 83 serves as the operation start electrode, the second sensor electrode 82 serves as the adjacent electrode adjacent to the operation start electrode, and the first sensor electrode 81 serves as the operation end electrode. When performing the first operation or the second operation, the user may move a part of the body other than a hand toward the sensor electrode or may move his or her belongings toward the sensor electrode.

The controller 85 will now be described.

The controller 85 includes a start electrode determination unit 91 that determines the operation start electrode, an operation determination unit 92 that determines whether the user has performed the first operation or the second operation, and a command unit 93 that outputs an opening command signal or a closing command signal in reference to the operation performed by the user.

The sensor electrodes 81 to 83 include two sensor electrodes at the leading ends in the first direction D1 and the second direction D2, respectively. The start electrode determination unit 91 defines, as the operation start electrode, one of the two sensor electrodes of which the capacitance remains greater than or equal to a first determination value C1Th over a first determination time Tx. In other words, the start electrode determination unit 91 determines whether the first sensor electrode 81 or the third sensor electrode 83 is the operation start electrode. It is preferred that the first determination value C1Th and the first determination time Tx be set in advance. For example, the first determination time Tx simply needs to be approximately 0.5 seconds to 1.0 second. In the following description, the determination for defining the start electrode is also referred to as a start electrode determination. Further, a state in which the start electrode is defined is referred to as a state in which the start electrode determination is established.

The operation determination unit 92 determines that the first operation has been performed when the sensor electrode of which the capacitance increases is sequentially shifted in the first direction D1 from the first sensor electrode 81 in a case where the operation start electrode is the first sensor electrode 81. More specifically, the operation determination unit 92 determines that the first operation has been performed when capacitance C2 of the second sensor electrode 82 (adjacent electrode) becomes greater than or equal to a second determination value C2Th and then capacitance C3 of the third sensor electrode 83 (operation end electrode) becomes greater than or equal to a third determination value C3Th in the case where the operation start electrode is the first sensor electrode 81.

The operation determination unit 92 determines that the second operation has been performed when the sensor electrode of which the capacitance increases is sequentially shifted in the second direction D2 from the third sensor electrode 83 in a case where the operation start electrode is the third sensor electrode 83. More specifically, the operation determination unit 92 determines that the second operation has been performed when capacitance C2 of the second sensor electrode 82 (adjacent electrode) becomes greater than or equal to the second determination value C2Th and then capacitance C1 of the first sensor electrode 81 (operation end electrode) becomes greater than or equal to the third determination value C3Th in the case where the operation start electrode is the third sensor electrode 83. In the following description, the determination of whether the first operation or the second operation has been performed is also referred to as a swipe determination. Further, a state in which the first operation or the second operation is determined as having been performed in the swipe determination is referred to as a state in which the swipe determination is established.

The first determination value C1Th is used for the operation start electrode. The third determination value C3Th is used for the operation end electrode. In other words, the first determination value C1Th is not always used for the first sensor electrode 81, and the third determination value C3Th is not always used for the third sensor electrode 83.

The manner of detecting the first operation by a controller of a comparative example will now be described with reference to FIG. 3. The controller of the comparative example sets the second determination value C2Th and the third determination value C3Th to be equal to the first determination value C1Th.

Figure 3:
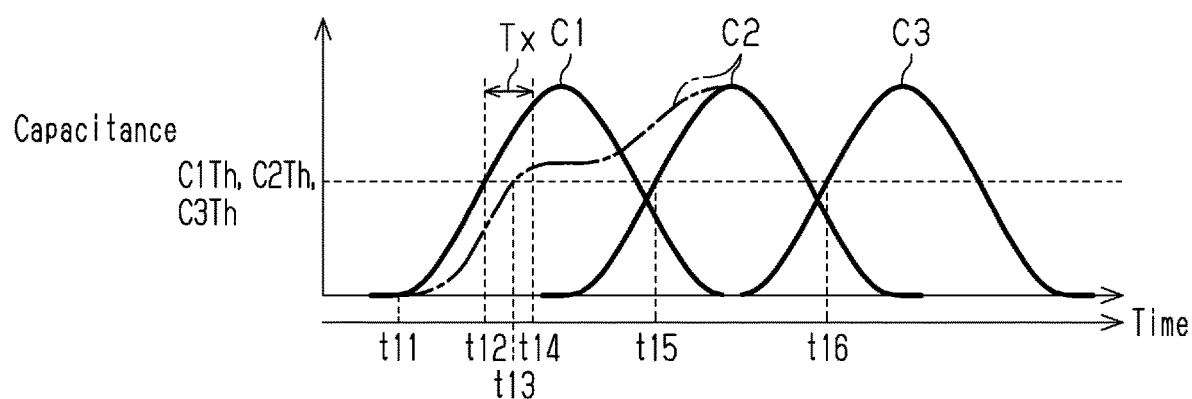
FIG. 3 is a timing diagram showing changes in the capacitances of the sensor electrodes of the vehicle operation detection device according to a comparative example when the user performs the first operation.

As shown by the solid line in FIG. 3, when the user performs the first operation, capacitance C1 of the first sensor electrode 81 starts to increase from a first point in time t11 as a hand of the user approaches the first sensor electrode 81. At a second point in time t12, capacitance C1 of the first sensor electrode 81 becomes greater than or equal to the first determination value C1Th. At a fourth point in time t14, when the time elapsed from the second point in time t12 becomes the first determination time Tx, the first sensor electrode 81 is defined as the operation start electrode. Subsequently, when the user moves, in the first direction D1, the hand that the user has moved toward the first sensor electrode 81, capacitance C2 of the second sensor electrode 82 becomes greater than or equal to the second determination value C2Th at a fifth point in time t15 and capacitance C3 of the third sensor electrode 83 becomes greater than or equal to the third determination value C3Th at a sixth point in time t16. Thus, the controller of the comparative example determines that the first operation was performed at the point in time t16.

In some manners of operating the operation detection device 80 by the user, for example, when the user performs the first operation, as shown by the alternate long and short dashed line in FIG. 3, capacitance C2 of the second sensor electrode 82 may increase together with capacitance C1 of the first sensor electrode 81. More specifically, when the user moves a hand toward the first sensor electrode 81 with the palm spread to a large extent or when the user moves a hand toward a position of the first sensor electrode 81 proximate to the second sensor electrode 82, capacitance C1 of the first sensor electrode 81 and capacitance C2 of the second sensor electrode 82 may both increase.

In this case, as shown in FIG. 3, capacitance C2 of the second sensor electrode 82 becomes greater than or equal to the second determination value C2Th at a third point in time t13 prior to the fourth point in time t14, which is when the operation start electrode is defined. In other words, after the first sensor electrode 81 is defined as the operation start electrode, capacitance C2 of the second sensor electrode 82 does not transition from a value less than the second determination value C2Th to a value greater than or equal to the second determination value C2Th. Accordingly, as shown by the alternate long and short dashed line in FIG. 3, when capacitance C2 of the second sensor electrode 82 changes, the controller of the comparative example is unable to determine that the first operation has been performed.

Thus, the operation determination unit 92 determines whether the capacitance of the adjacent electrode is greater than or equal to the first determination value C1Th at the point in time when the operation start electrode is defined. In a case where the capacitance of the adjacent electrode is greater than or equal to the first determination value C1Th at the point in time when the operation start electrode is defined, the operation determination unit 92 sets the second determination value C2Th to be greater than the first determination value C1Th. When the capacitance of the adjacent electrode is greater than or equal to the second determination value C2Th, the operation determination unit 92 determines that the capacitance of the adjacent electrode has increased. When the capacitance of the adjacent electrode is less than the second determination value C2Th, the operation determination unit 92 determines that the capacitance of the adjacent electrode has not increased.

The operation determination unit 92 calculates the second determination value C2Th in reference to the magnitude of the capacitance of the adjacent electrode at the point in time when the operation start electrode is defined. More specifically, the operation determination unit 92 sets the second determination value C2Th to a value obtained by adding an offset value COff to the capacitance of the adjacent electrode at the point in time when the operation start electrode is defined. In the first embodiment, the offset value COff is a preset fixed value.

When the capacitance of the adjacent electrode is less than the first determination value C1Th at the point in time when the operation start electrode is defined, the operation determination unit 92 sets the second determination value C2Th to be equal to the first determination value C1Th. When the capacitance of the adjacent electrode is greater than or equal to the second determination value C2Th, the operation determination unit 92 determines that the capacitance of the adjacent electrode has increased. When the capacitance of the adjacent electrode is less than the second determination value C2Th, the operation determination unit 92 determines that the capacitance of the adjacent electrode has not increased.

In the first embodiment, the third determination value C3Th used to determine an increase in the capacitance of the operation end electrode simply needs to be set to be equal to the first determination value C1Th. In another embodiment, the third determination value C3Th may be less than the first determination value C1Th or may be greater than the first determination value C1Th.

The start electrode determination unit 91 suspends the determination of the operation start electrode when the capacitance of another sensor electrode becomes greater than or equal to a preset upper limit determination value CLTh during the determination of the operation start electrode. Further, the operation determination unit 92 suspends the determination of whether the first operation or the second operation has been performed when the capacitance of the other sensor electrode, which is not subject to the determination, becomes greater than or equal to the upper limit determination value CLTh during the determination of whether the capacitances of the adjacent electrode and the operation end electrode have increased.

The upper limit determination value CLTh is used to determine that the detection target is too close to the sensor electrode. The upper limit determination value CLTh cannot be achieved just by the user moving a hand toward the sensor electrode. That is, the upper limit determination value CLTh is set to be greater than the first determination value C1Th, the second determination value C2Th, and the third determination value C3Th.

When the time increases for the sensor electrode of which the capacitance increases to be shifted to a sensor electrode adjacent to that sensor electrode in the first direction D1 or the second direction D2, the operation determination unit 92 determines that the first operation or the second operation by the user has been suspended, and suspends the determination of whether the first operation or the second operation has been performed. More specifically, in a case where the period from when the operation start electrode is defined to when the capacitance of the adjacent electrode increases and the period from when the capacitance of the adjacent electrode increases to when the capacitance of the operation end electrode increases become greater than or equal to a preset second determination time Ty, the operation determination unit 92 suspends the determination of whether the first operation or the second operation has been performed. The length of the second determination time Ty may be set to any length.

When the first operation is determined as having been performed, the command unit 93 outputs, to the door control device 100, an opening command signal used to open the vehicle door 30. When the second operation is determined as having been performed, the command unit 93 outputs, to the door control device 100, a closing command signal used to close the vehicle door 30.

When receiving the opening command signal, the door control device 100 causes the door drive unit 60 and the door lock drive unit 70 to open the vehicle door 30. When receiving the closing command signal, the door control device 100 causes the door drive unit 60 and the door lock drive unit 70 to close the vehicle door 30.

The flow of a process executed by the controller 85 to detect the first operation will now be described with reference to the flowchart shown in FIG. 4. In the following description, capacitances C1 to C3 of the first sensor electrode 81, the second sensor electrode 82, and the third sensor electrode 83 are obtained when the steps are executed unless otherwise specified.

Figure 4:
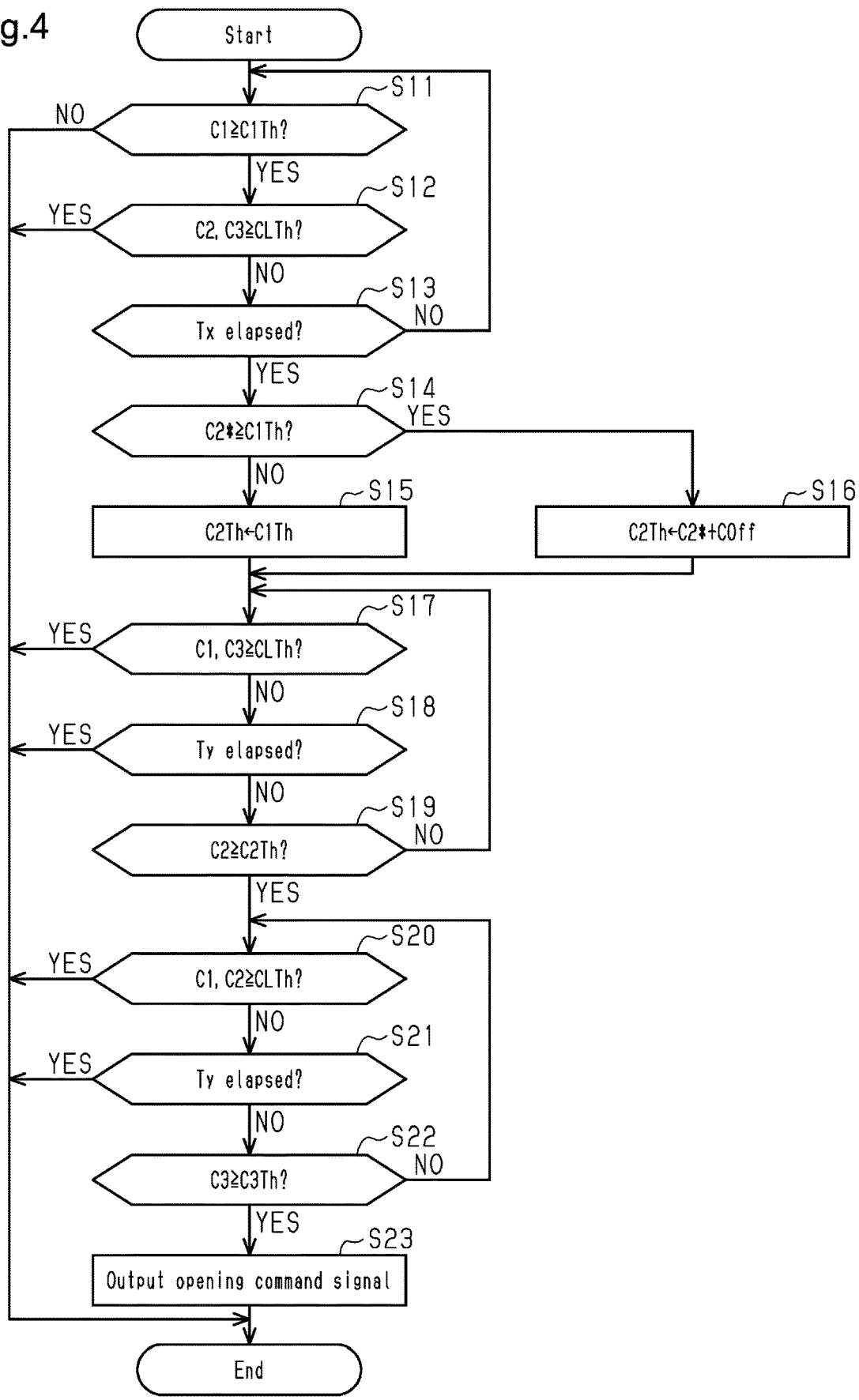
FIG. 4 is a flowchart illustrating the flow of a process executed by the controller of the vehicle operation detection device in FIG. 2.

As shown in FIG. 4, the controller 85 determines whether capacitance C1 of the first sensor electrode 81 is greater than or equal to the first determination value C1Th (S11). When capacitance C1 of the first sensor electrode 81 is less than the first determination value C1Th (S11: NO), the controller 85 ends the process. When capacitance C1 of the first sensor electrode 81 is greater than or equal to the first determination value C1Th (S11: YES), that is, when the detection target is approaching the first sensor electrode 81, the controller 85 determines whether capacitances C2, C3 of the second sensor electrode 82 and the third sensor electrode 83 are greater than or equal to the upper limit determination value CLTh (S12).

When at least one of capacitances C2, C3 of the second sensor electrode 82 and the third sensor electrode 83 is greater than or equal to the upper limit determination value CLTh (S12: YES), the controller 85 ends the process. When capacitances C2, C3 of the second sensor electrode 82 and the third sensor electrode 83 are both less than the upper limit determination value CLTh (S12: NO), the controller 85 determines whether the first determination time Tx has elapsed since an affirmative determination was initially made in step S11 (S13).

In a case where the first determination time Tx has not elapsed (S13: NO), the controller 85 returns the process to step S11. In a case where the first determination time Tx has elapsed (S13: YES), that is, in a case where the first sensor electrode 81 is defined as the operation start electrode, the controller 85 determines whether capacitance C2* of the second sensor electrode 82 is greater than or equal to the first determination value C1Th (S14). Capacitance C2* of the second sensor electrode 82 refers to capacitance C2 of the second sensor electrode 82 at the point in time when the operation start electrode is defined.

When capacitance C2* of the second sensor electrode 82 is less than the first determination value C1Th (S14: NO), the controller 85 sets the second determination value C2Th to be equal to the first determination value C1Th (S15). When capacitance C2* of the second sensor electrode 82 is greater than or equal to the first determination value C1Th (S14: YES), the controller 85 sets the second determination value C2Th to a value obtained by adding the offset value COff to capacitance C2* of the second sensor electrode 82 (S16).

Subsequently, the controller 85 determines whether capacitances C1, C3 of the first sensor electrode 81 and the third sensor electrode 83 are greater than or equal to the upper limit determination value CLTh (S17). When at least one of capacitances C1, C3 of the first sensor electrode 81 and the third sensor electrode 83 is greater than or equal to the upper limit determination value CLTh (S17: YES), the controller 85 ends the process.

When capacitances C1, C3 of the first sensor electrode 81 and the third sensor electrode 83 are both less than the upper limit determination value CLTh (S17: NO), the controller 85 determines whether the second determination time Ty has elapsed since an affirmative determination was made in step S13 (S18). In other words, the controller 85 determines whether the second determination time Ty has elapsed from the point in time when the operation start electrode was defined.

In a case where the second determination time Ty has elapsed from the point in time when the operation start electrode was defined (S18: YES), for example, in a case where the user has suspended the first operation, the controller 85 ends the process. In a case where the second determination time Ty has not elapsed from the point in time when the operation start electrode was defined (S18: NO), the controller 85 determines whether capacitance C2 of the second sensor electrode 82 (adjacent electrode) is greater than or equal to the second determination value C2Th (S19).

When capacitance C2 of the second sensor electrode 82 is less than the second determination value C2Th (S19: NO), the controller 85 returns the process to step S17. When capacitance C2 of the second sensor electrode 82 is greater than or equal to the second determination value C2Th (S19: YES), that is, when capacitance C2 of the second sensor electrode 82 increases, capacitances C1, C2 of the first sensor electrode 81 and the second sensor electrode 82 are greater than or equal to the upper limit determination value CLTh (S20). When at least one of capacitances C1, C2 of the first sensor electrode 81 and the second sensor electrode 82 is greater than or equal to the upper limit determination value CLTh (S20: YES), the controller 85 ends the process.

When capacitances C1, C2 of the first sensor electrode 81 and the second sensor electrode 82 are both less than the upper limit determination value CLTh (S20: NO), the controller 85 determines whether the second determination time Ty has elapsed since an affirmative determination was made in step S19 (S21). In other words, the controller 85 determines whether the second determination time Ty has elapsed after determining that the capacitance of the adjacent electrode increased.

In a case where the second determination time Ty has elapsed since an affirmative determination was made in step S19 (S21: YES), for example, in a case where the user has suspended the first operation, the controller 85 ends the process. In a case where the second determination time Ty has not elapsed since an affirmative determination was made in step S19 (S21: NO), the controller 85 determines whether capacitance C3 of the third sensor electrode 83 is greater than or equal to the third determination value C3Th (S22).

When capacitance C3 of the third sensor electrode 83 is less than the third determination value C3Th (S22: NO), the controller 85 returns the process to step S20. When capacitance C3 of the third sensor electrode 83 is greater than or equal to the third determination value C3Th (S22: YES), that is, when capacitance C3 of the third sensor electrode 83 increases, the controller 85 outputs the opening command signal (S23). Subsequently, the controller 85 ends the process.

The flow of a process executed by the controller 85 to detect the second operation will not be illustrated or described. In the flow of the process executed by the controller 85 to detect the second operation, "C1" and "C3" are replaced with each other in steps S11, S12, S20, S22 and step S23 is replaced with "output closing command signal" in FIG. 4.

The operation of the first embodiment will now be described.

Figure 5:
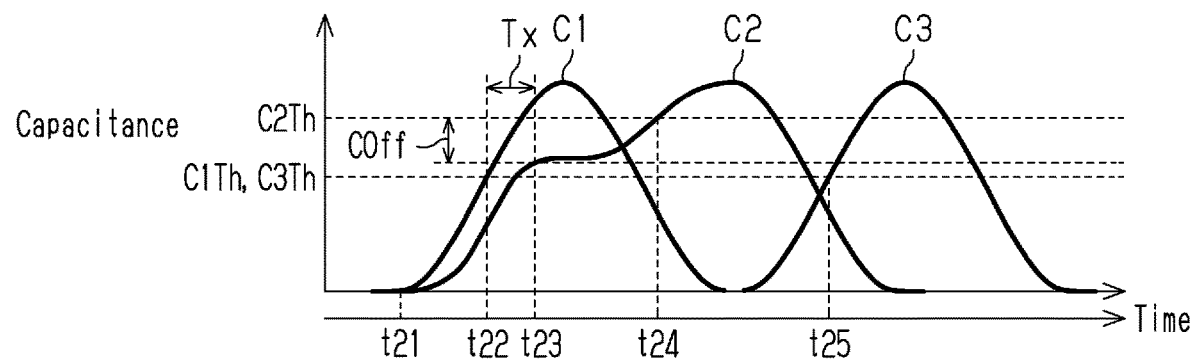
FIG. 5 is a timing diagram showing changes in the capacitances of the sensor electrodes of the vehicle operation detection device in FIG. 2 when the user performs the first operation.

More specifically, the operation obtained when the operation detection device 80 detects the first operation will now be described with reference to FIG. 5. FIG. 5 shows changes in the capacitances of the sensor electrodes in a case where the user moves a hand toward the first sensor electrode 81 with the palm spread or when the user moves a hand toward a position of the first sensor electrode 81 proximate to the second sensor electrode 82.

As shown in FIG. 5, at a first point in time t21, capacitance C1 of the first sensor electrode 81 and capacitance C2 of the second sensor electrode 82 start to increase as a hand of the user approaches the sensor electrodes. When the hand of the user further approaches the first sensor electrode 81, capacitance C1 of the first sensor electrode 81 becomes greater than or equal to the first determination value C1Th at a second point in time t22. Capacitance C1 of the first sensor electrode 81 remains greater than or equal to the first determination value C1Th over the first determination time Tx from the second point in time t22 to a third point in time t23. That is, at the third point in time t23, the first sensor electrode 81 is defined as the operation start electrode.

At the third point in time t23, capacitance C2 of the second sensor electrode 82 (adjacent electrode) is greater than or equal to the first determination value C1Th. Thus, the second determination value C2Th used to determine the movement of the detection target toward the second sensor electrode 82 is obtained by adding the offset value COff to capacitance C2 (C2*) of the second sensor electrode 82 at the point in time when the operation start electrode is defined.

Subsequently, when the user moves, in the first direction D1, the hand that the user has moved toward the first sensor electrode 81, capacitance C2 of the second sensor electrode 82 becomes greater than or equal to the second determination value C2Th at a fourth point in time t24 and capacitance C3 of the third sensor electrode 83 becomes greater than or equal to the third determination value C3Th at a fifth point in time t25. That is, the sensor electrode of which the capacitance increases is sequentially shifted in the first direction D1 from the first sensor electrode 81 (operation start electrode).

Thus, at the point in time t25, it is determined that the user has performed the first operation, so that the opening command signal is output to the door control device 100. This causes the vehicle door 30 to open.

The advantages of the second embodiment will now be described.

(1) The operation detection device 80 determines that the capacitance of the adjacent electrode has increased when the capacitance of the adjacent electrode is greater than or equal to the second determination value C2Th, which is greater than the first determination value C1Th used to determine the operation start electrode. This allows the operation detection device 80 to easily determine the first operation or the second operation in a correct manner even if a hand of the user approaches a sensor electrode serving as the adjacent electrode when the user starts the first operation or the second operation. That is, the operation detection device 80 is capable of increasing the accuracy of detecting an operation performed by the user.

(2) The capacitance of the adjacent electrode at the point in time when the operation start electrode is defined varies depending on how a hand of the user approaches the operation start electrode. In this regard, the operation detection device 80 calculates the second determination value C2Th in reference to the magnitude of the capacitance of the adjacent electrode at the point in time when the operation start electrode is defined. This allows the operation detection device 80 to calculate the second determination value C2Th to a suitable magnitude.

(3) The operation detection device 80 sets the second determination value C2Th to the value obtained by adding the offset value COff to the capacitance of the adjacent electrode at the point in time when the operation start electrode is defined. Thus, the operation detection device 80 easily calculates the second determination value C2Th that is based on the magnitude of the capacitance of the adjacent electrode at the point in time when the operation start electrode is defined.

(4) The operation detection device 80 sets the second determination value C2Th to be equal to the first determination value C1Th when the operation detection device 80 is capable of correctly determining whether the capacitance of the adjacent electrode has increased without setting the second determination value C2Th to be greater than the first determination value C1Th. More specifically, when capacitance C2 of the second sensor electrode 82 is less than the first determination value C1Th at the point in time when the operation start electrode is defined, the operation detection device 80 sets the second determination value C2Th to be equal to the first determination value C1Th. This allows the operation detection device 80 to set the second determination value C2Th to a suitable magnitude.

(5) When, for example, the user performs the first operation or the second operation, an increase does not occur in the capacitance of a sensor electrode toward which the user has already moved a hand (i.e., a sensor electrode that becomes relatively farther from a hand of the user). Further, when the user performs the first operation or the second operation, an increase does not occur in the capacitance of a sensor electrode toward which the user has not moved a hand yet (i.e., a sensor electrode located at a position separated from a hand of the user). In this regard, the operation detection device 80 suspends the determination of whether the first operation or the second operation has been performed when wetting, resulting from precipitation or the like, causes the capacitance of a sensor electrode that is not subject to the determination to become greater than or equal to the upper limit determination value CLTh. Thus, the operation detection device 80 reduces the risk of erroneously determining the first operation or the second operation.

Second Embodiment

The operation detection device according to a second embodiment will now be described. In the description of the second embodiment, the same reference numerals are given to those components that are the same as or similar to the corresponding components of the first embodiment, and description thereof is omitted.

Figure 6:
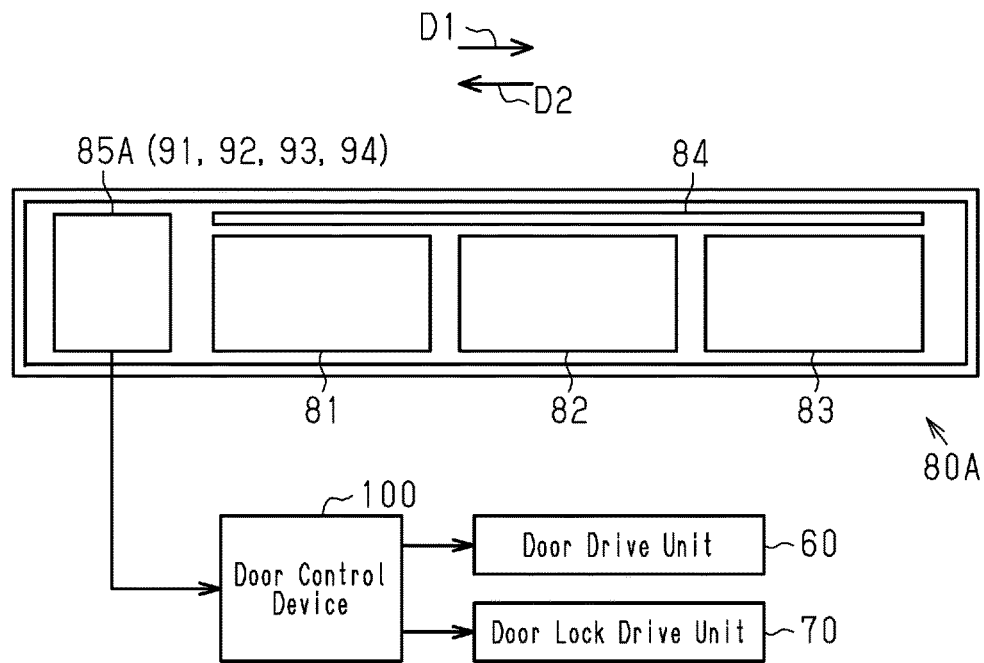
FIG. 6 is a schematic diagram showing the configuration of the vehicle operation detection device according to a second embodiment.

As shown in FIG. 6, the vehicle 10 includes an operation detection device 80A in the second embodiment. The operation detection device 80A detects an operation performed by the user to open and close the vehicle door 30.

The operation detection device 80A is located at a position that allows the user to operate the operation detection device 80A from the outside of the vehicle door 30. More specifically, the operation detection device 80A is located on the inner side of the door trim, which is an interior component of the vehicle door 30. Further, the operation detection device 80A is located at a position that allows the user to visually recognize the operation detection device 80A through the window glass 31 of the vehicle door 30 from the outer side of the vehicle 10.

As shown in FIG. 6, the operation detection device 80A includes the first sensor electrode 81, the second sensor electrode 82, the third sensor electrode 83, a fourth sensor electrode 84, and a controller 85A. The controller 85A outputs a signal to the door control device 100 in reference to the detection results of the sensor electrodes 81 to 84.

The fourth sensor electrode 84 has the shape of a rectangular plate in the same manner as the other sensor electrodes 81 to 83. The length of the fourth sensor electrode 84 in the longitudinal direction is equal to the sum of the lengths of the first sensor electrode 81, the second sensor electrode 82, and the third sensor electrode 83 in the arrangement direction. The fourth sensor electrode 84 is located above the first sensor electrode 81, the second sensor electrode 82, and the third sensor electrode 83. The thickness direction of the fourth sensor electrode 84 is oriented toward the up-down direction of the vehicle 10.

The sensor electrodes 81 to 84 form a pseudocapacitor in cooperation with a detection target that has approached the sensor electrodes 81 to 84. Thus, as the detection target becomes closer to the sensor electrodes 81 to 84, the capacitance defined by the positional relationship between the sensor electrodes 81 to 84 and the detection target becomes larger. For the capacitance to increase when the detection target approaches each of the sensor electrodes from the outer side of the vehicle 10, the detection ranges of the first sensor electrode 81, the second sensor electrode 82, and the third sensor electrode 83 spread outward from the vehicle 10. In contrast, for the capacitance to increase when the detection target approaches the sensor electrode from the upper side of the vehicle 10, the detection range of the fourth sensor electrode 84 spreads upward from the door trim. The detection ranges of the first sensor electrode 81, the second sensor electrode 82, and the third sensor electrode 83 slightly spread upward from the door trim. The detection range of the fourth sensor electrode 84 slightly spreads outward from the vehicle 10.

It is assumed that the first operation is performed as the operation for causing the vehicle door 30 to open and the second operation is performed as the operation for causing the vehicle door 30 to close. Additionally, it is assumed that the user performs an operation for holding a hand over the second sensor electrode 82 for a while as the operation for closing the vehicle door 30. In the following description, the operation in which the user holds a hand over the second sensor electrode 82 for a while is referred to as the hand-holding operation.

The controller 85A will now be described.

The controller 85A includes the start electrode determination unit 91, the operation determination unit 92, the command unit 93, and a calibration unit 94.

The calibration unit 94 calibrates the sensor electrodes 81 to 84 in order to respond to changes in the external environment. More specifically, when a calibration condition is satisfied, the calibration unit 94 treats capacitances C1 to C4 of the sensor electrodes 81 to 84 at that moment as 0. The calibration condition is satisfied when the capacitance of any one of the sensor electrodes remains greater than or equal to a calibration determination value CCTh or less than or equal to the calibration determination value CCTh over a calibration determination time TCTh. The calibration of the sensor electrodes 81 to 84 will now be described with reference to FIG. 7.

Figure 7:
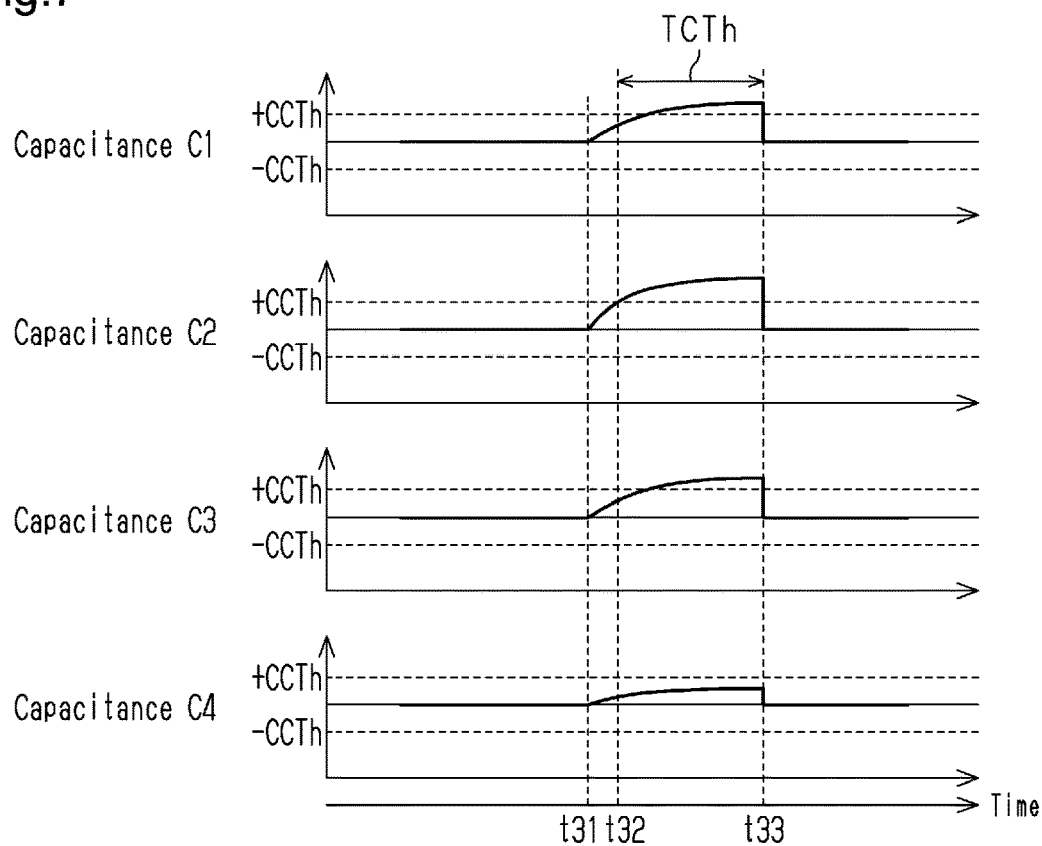
FIG. 7 is a timing diagram showing changes in the capacitances of the sensor electrodes of the vehicle operation detection device in FIG. 6 when the sensor electrodes are calibrated.

As shown in FIG. 7, when a change in the external environment occurs so as to affect capacitances C1 to C4 of the sensor electrodes 81 to 84, capacitances C1 to C4 of the sensor electrodes 81 to 84 start to increase from 0 at a first point in time t31. The change in the external environment occurs when, for example, the vehicle 10 moves from an environment in which the vehicle 10 is not hit by rain to an environment in which the vehicle 10 is hit by rain. At a second point in time t32, capacitance C2 of the second sensor electrode 82 becomes greater than or equal to the calibration determination value CCTh earlier than capacitances C1, C3, C4 of the other sensor electrodes 81, 83, 84. Subsequent to the second point in time t32, capacitances C1 to C4 of the sensor electrodes 81 to 84 increase for a while and then become substantially constant.

Then, calibration is executed for all the sensor electrodes 81 to 84 at a third point in time t33 when the time elapsed from the second point in time t32 becomes greater than or equal to the calibration determination time TCTh. That is, the reference value treated as 0 is changed in the sensor electrodes 81 to 84. Thus, at the third point in time t33, capacitance C1 of the first sensor electrode 81 becomes 0, capacitance C2 of the second sensor electrode 82 becomes 0, capacitance C3 of the third sensor electrode 83 becomes 0, and capacitance C4 of the fourth sensor electrode 84 becomes 0.

Such calibration of the sensor electrodes 81 to 84 by the calibration unit 94 allows the operation detection device 80A to correctly detect an operation performed by the user even when capacitances C1 to C4 of the sensor electrodes 81 to 84 are increased or decreased by external environment such as precipitation. It is preferred that the calibration determination time TCTh be, for example, several seconds to approximately ten seconds. The calibration determination value CCTh may be a variable value corresponding to the environment in which the vehicle 10 is used, or may be a preset fixed value.

The operation determination unit 92 determines that the hand-holding operation has been performed when capacitance C2 of the second sensor electrode 82 becomes greater than or equal to a hand-holding determination value CPTh over a hand-holding determination time TPTh. The hand-holding determination time TPTh simply needs to be shorter than the calibration determination time TCTh, for example, one to several seconds. The hand-holding determination value CPTh may be set to be, for example, equal to the second determination value C2Th or different from the second determination value C2Th. In the following description, this determination is referred to as the hand-holding determination.

When the first operation or the hand-holding operation is determined as having been performed, the command unit 93 outputs, to the door control device 100, the opening command signal used to open the vehicle door 30. When the second operation is determined as having been performed, the command unit 93 outputs, to the door control device 100, the closing command signal used to close the vehicle door 30.

The first sensor electrode 81, the second sensor electrode 82, and the third sensor electrode 83 of the operation detection device 80A are directed outward from the vehicle 10 through the window glass 31. Thus, capacitances C1 to C3 of the first sensor electrode 81, the second sensor electrode 82, and the third sensor electrode 83 are changed by various disturbances. Examples of the disturbance include a case where water droplets are on the window glass 31, a case where water droplets flow along the window glass 31, a case where the window glass 31 is lifted and lowered, and a case in which the user leans against the vehicle door 30.

Accordingly, it is desired that the start electrode determination unit 91 does not define the operation start electrode when a disturbance occurs. Further, it is desired that the operation determination unit 92 does not determine that a swipe operation and the hand-holding operation have been performed when a disturbance occurs. Thus, the start electrode determination unit 91 and the operation determination unit 92 execute the following auxiliary determinations in order to distinguish a user's operation from a disturbance.

More specifically, in a case where the start electrode determination is established, but any one of the following auxiliary determinations is not satisfied (i.e., in a case where it is determined that a user's operation has not been performed), the start electrode determination unit 91 does not define the operation start electrode. Further, in a case where the swipe determination and the hand-holding determination are established but any one of the following auxiliary determinations is not satisfied (i.e., in a case where it is determined that a user's operation has not been performed), the operation determination unit 92 does not determine that the swipe operation and the hand-holding operation have been performed. The start electrode determination unit 91 and the operation determination unit 92 may execute only part of the following auxiliary determinations.

The auxiliary determinations for the hand-holding determination executed by the operation determination unit 92 will now be described.

First Auxiliary Determination for Hand-Holding Determination

When the user performs the hand-holding operation, the interval between the hand of the user and the second sensor electrode 82 tends to be substantially constant. In contrast, during precipitation, raindrops tend to move into and out of the detection range of the second sensor electrode 82. Thus, when the user performs the hand-holding operation, the fluctuation range of capacitance C2 of the second sensor electrode 82 tends to be small during the hand-holding determination time TPTh. Further, in the case of precipitation, the fluctuation range of capacitance C2 of the second sensor electrode 82 tends to be large during the hand-holding determination time TPTh.

Thus, during the hand-holding determination, the operation determination unit 92 determines that a user's operation has been performed in a case where capacitance C2 of the second sensor electrode 82 falls within a specific fluctuation range over a specific determination time. In contrast, during the hand-holding determination, the operation determination unit 92 determines that a user's operation has not been performed in a case where capacitance C2 of the second sensor electrode 82 does not fall within the specific fluctuation range over the specific determination time. This determination is executed from, for example, the point in time when a hand of the user finished approaching the second sensor electrode 82, that is, the point in time when the rate of change of capacitance C2 of the second sensor electrode 82 became gradual. It is preferred that the specific determination time be shorter than the hand-holding determination time TPTh.

Second Auxiliary Determination for Hand-Holding Determination

When the user performs the hand-holding operation, a hand of the user, which is relatively large, is located in the detection range of the fourth sensor electrode 84 spreading outward from the vehicle 10 so that capacitance C4 of the fourth sensor electrode 84 easily increases. In contrast, during precipitation, only small raindrops are located in the detection range of the fourth sensor electrode 84 spreading outward from the vehicle 10 so that capacitance C4 of the fourth sensor electrode 84 does not easily increase.

Thus, during the hand-holding determination, the operation determination unit 92 determines that a user's operation has been performed in a case where capacitance C4 of the fourth sensor electrode 84 becomes greater than or equal to a specific determination value over a specific determination time. In contrast, during the hand-holding determination, the operation determination unit 92 determines that a user's operation has not been performed in a case where capacitance C4 of the fourth sensor electrode 84 becomes less than the specific determination value over the specific determination time. This determination is also executed from, for example, the point in time when a hand of the user finished approaching the second sensor electrode 82, that is, the point in time when the rate of change of capacitance C2 of the second sensor electrode 82 became gradual. It is preferred that the specific determination time be shorter than the hand-holding determination time TPTh. It is preferred that the specific determination value be smaller than the hand-holding determination value CPTh.

Third Auxiliary Determination for Hand-Holding Determination

When the user performs the hand-holding operation, the user moves a hand toward the second sensor electrode 82. Thus, only capacitance C2 of the second sensor electrode 82 easily increases. In contrast, when the window glass 31 is lifted and lowered and when the user leans against the vehicle door 30, the window glass 31 and the body of the user approach the first sensor electrode 81 and the third sensor electrode 83 as well as the second sensor electrode 82. Thus, capacitance C1 of the first sensor electrode 81 and capacitance C3 of the third sensor electrode 83 also easily increase in addition to capacitance C2 of the second sensor electrode 82. During precipitation, capacitances C1 to C3 of the sensor electrodes 81 to 83 may change in the same manner.

Thus, during the hand-holding determination, the operation determination unit 92 calculates a first difference between capacitance C2 of the second sensor electrode 82 and capacitance C1 of the first sensor electrode 81 and a second difference between capacitance C2 of the second sensor electrode 82 and capacitance C3 of the third sensor electrode 83. Subsequently, the operation determination unit 92 determines that a user's operation has been performed when the first difference and the second difference are both greater than or equal to a specific difference determination value, and determines that a user's operation has not been performed when at least one of the first difference and the second difference is less than the specific difference determination value. It is preferred that this determination be executed at a certain point in time during the hand-holding determination time TPTh.

Fourth Auxiliary Determination for Hand-Holding Determination

As described above, the first auxiliary determination and the second auxiliary determination each have a determination time while the third auxiliary determination does not have a determination time. Thus, when the user performs the hand-holding operation, the first auxiliary determination and the second auxiliary determination are established after the third auxiliary determination is established. In contrast, during precipitation, capacitances C1 to C4 of the sensor electrodes 81 to 84 increase and decrease irregularly. Thus, even if the first auxiliary determination, the second auxiliary determination, and the third auxiliary determination are all established, the establishment order of the first auxiliary determination, the second auxiliary determination, and the third auxiliary determination tends to be irregular.

Thus, during the hand-holding determination, the operation determination unit 92 determines that a user's operation has been performed when the third auxiliary determination is established first among the first auxiliary determination, the second auxiliary determination, and the third auxiliary determination. In contrast, during the hand-holding determination, the operation determination unit 92 determines that a user's operation has not been performed when the third auxiliary determination is established third among the first auxiliary determination, the second auxiliary determination, and the third auxiliary determination.

During the hand-holding determination, the operation determination unit 92 may determine that a user's operation has been performed also when the third auxiliary determination is established second and the first auxiliary determination or the second auxiliary determination is established third among the first auxiliary determination, the second auxiliary determination, and the third auxiliary determination.

Fifth Auxiliary Determination for Hand-Holding Determination

When the user moves a hand toward the second sensor electrode 82 in order to perform the hand-holding operation, capacitance C1 of the first sensor electrode 81 and capacitance C3 of the third sensor electrode 83 do not easily have a negative value. In this case, the rate of change of capacitance C1 of the first sensor electrode 81 and the rate of change of capacitance C3 of the third sensor electrode 83 do not easily have a negative value. In contrast, during precipitation, the sensor electrodes 81 to 84 may be calibrated in a state in which water droplets are on the surface of the window glass 31 located in the detection range of the first sensor electrode 81. In this case, capacitance C1 of the first sensor electrode 81 with water droplets on the window glass 31 is the reference value. Thus, when water droplets flow out of the detection range of the first sensor electrode 81, capacitance C1 of the first sensor electrode 81 may have a negative value. Likewise, the rate of change of capacitance C1 of the first sensor electrode 81 may have a negative value. The same applies to capacitance C3 of the third sensor electrode 83 and the rate of change of capacitance C3 of the third sensor electrode 83.

Thus, during the hand-holding determination, the operation determination unit 92 determines that a user's operation has been performed when capacitance C1 of the first sensor electrode 81 and capacitance C3 of the third sensor electrode 83 are both greater than or equal to a specific determination value. In contrast, during the hand-holding determination, the operation determination unit 92 determines that a user's operation has not been performed when at least one of capacitance C1 of the first sensor electrode 81 and capacitance C3 of the third sensor electrode 83 is less than the specific determination value. The specific determination value may be set to 0, or may be set to a value smaller than 0 on the basis of the influence of, for example, noise.

Further, during the hand-holding determination, the operation determination unit 92 determines that a user's operation has been performed when the rate of change of capacitance C1 of the first sensor electrode 81 and the rate of change of capacitance C3 of the third sensor electrode 83 are both greater than or equal to a specific rate determination value. Further, during the hand-holding determination, the operation determination unit 92 determines that a user's operation has not been performed when at least one of the rate of change of capacitance C1 of the first sensor electrode 81 and the rate of change of capacitance C3 of the third sensor electrode 83 is less than the specific rate determination value. The specific rate determination value may be set to 0, or may be set to a value smaller than 0 on the basis of the influence of, for example, noise.

Sixth Auxiliary Determination for Hand-Holding Determination

Even in a case where a disturbance such as precipitation acts on vehicle 10, when the degree of the disturbance is small and the above-described determination value is set to be less than 0, capacitance C1 of the first sensor electrode 81 and capacitance C3 of the third sensor electrode 83 may both remain greater than or equal to the above-described determination value. Likewise, when the degree of the disturbance is small and the above-described rate determination value is set to be less than 0, the rate of change of capacitance C1 of the first sensor electrode 81 and the rate of change of capacitance C3 of the third sensor electrode 83 may both remain greater than or equal to the above-described rate determination value. However, in these cases, capacitance C1 of the first sensor electrode 81 and capacitance C3 of the third sensor electrode 83 both tend to continue to have a negative value.

Thus, during the hand-holding determination, the operation determination unit 92 determines that a user's operation has not been performed when capacitance C1 of the first sensor electrode 81 and capacitance C3 of the third sensor electrode 83 both continue to have a negative value. For example, during the hand-holding determination, the operation determination unit 92 monitors capacitance C1 of the first sensor electrode 81 and capacitance C3 of the third sensor electrode 83 in each constant cycle. In all the cycles during the hand-holding determination, the operation determination unit 92 determines that a user's operation has not been performed when capacitance C1 of the first sensor electrode 81 and capacitance C3 of the third sensor electrode 83 do not have a positive value even if the fifth auxiliary determination of the hand-holding determination is established. The constant cycle simply needs to be, for example, several milliseconds to several tens of milliseconds.

Seventh Auxiliary Determination for Hand-Holding Determination

The operation detection device 80A is located on the inner side of the door trim, which is an interior component of the vehicle door 30. Thus, when the user seated on the seat adjacent to the vehicle door 30 places the elbow or the like on the door trim, the hand-holding determination may be established. However, in such a case where the user places the elbow or the like on the door trim, the elbow or the like approaches the fourth sensor electrode 84 from the front so that the rate of change of capacitance C4 of the fourth sensor electrode 84 tends to be high. In contrast, when the user performs the hand-holding operation, a hand of the user does not approach the fourth sensor electrode 84 from the front so that rate of change of capacitance C4 of the fourth sensor electrode 84 tends to be low.

Thus, during the hand-holding determination, the operation determination unit 92 determines that a user's operation from the outer side of the vehicle 10 has been performed in a case where the rate of change of capacitance C4 of the fourth sensor electrode 84 is less than a specific rate determination value. In contrast, during the hand-holding determination, the operation determination unit 92 determines that a user's operation from the outer side of the vehicle 10 has not been performed in a case where the rate of change of capacitance C4 of the fourth sensor electrode 84 is greater than or equal to the specific rate determination value. It is preferred that this determination be executed at the point in time when the rate of change of capacitance C4 of the fourth sensor electrode 84 tends to become large noticeably, for example, at the point in time when capacitance C2 of the second sensor electrode 82 becomes greater than or equal to the hand-holding determination value CPTh. The operation determination unit 92 may execute another auxiliary determination to determine whether a user's operation from the outer side of the vehicle 10 has been performed by comparing capacitance C4 of the fourth sensor electrode 84 with a specific determination value.

Eighth Auxiliary Determination for Hand-Holding Determination

During washing of the vehicle 10, the window glass 31 may be covered with bubbles or water may be splashed toward the window glass 31. Thus, when the sensor electrodes 81 to 84 are calibrated during washing of the vehicle 10, an exponential increase in capacitance C2 of the second sensor electrode 82 may cause capacitance C2 of the second sensor electrode 82 to become greater than or equal to the hand-holding determination value CPTh. In other words, capacitance C2 of the second sensor electrode 82 may increase to be greater than or equal to the hand-holding determination value CPTh at a speed that cannot be reached by the approaching speed of a hand of the user when the user performs the hand-holding operation.

Thus, the operation determination unit 92 determines that a user's operation has been performed in a case where the rate of change of capacitance C2 of the second sensor electrode 82 is less than a specific rate determination value at the beginning of the hand-holding determination (i.e., at the point in time when capacitance C2 of the second sensor electrode 82 exceeds the hand-holding determination value CPTh). In contrast, the operation determination unit 92 determines that a user's operation has not been performed in a case where the rate of change of capacitance C2 of the second sensor electrode 82 is greater than or equal to the specific rate determination value at the beginning of the hand-holding determination.

The auxiliary determinations for the start electrode determination executed by the start electrode determination unit 91 and the auxiliary determinations for the swipe determination executed by the operation determination unit 92 will now be described.

First Auxiliary Determination for Start Electrode Determination

When the user moves a hand toward the first sensor electrode 81 or the third sensor electrode 83 in order to define the operation start electrode, the capacitance of the operation start electrode increases while the capacitance of the operation end electrode does not easily increase. In contrast, during precipitation, capacitances C1 to C3 of the first sensor electrode 81, the second sensor electrode 82, and the third sensor electrode 83 increase and decrease irregularly. In other words, during precipitation, the capacitance of the operation end electrode may increase when the capacitance of the operation start electrode increases.

Thus, during the start electrode determination, the start electrode determination unit 91 determines that a user's operation has been performed in a case where the capacitance of a sensor electrode serving as the operation end electrode is less than a specific determination value. In contrast, during the start electrode determination, the start electrode determination unit 91 determines that a user's operation has not been performed in a case where the capacitance of the sensor electrode serving as the operation end electrode is greater than or equal to the specific determination value. This determination may be continued during the start electrode determination or may be executed at a certain point in time during the start electrode determination.

Second Auxiliary Determination for Start Electrode Determination

When the user moves a hand toward the first sensor electrode 81 or the third sensor electrode 83 in order to define the operation start electrode, the user needs to keep the hand close to the first sensor electrode 81 or the third sensor electrode 83. That is, when the operation start electrode is defined, capacitance C1 of the first sensor electrode 81 or capacitance C3 of the third sensor electrode 83 increases then remains a constant value so that the capacitance does not decrease. In contrast, during precipitation, capacitance C1 of the first sensor electrode 81 and capacitance C3 of the third sensor electrode 83 may not only increase and remain a constant value but also decrease. In other words, during precipitation, the rate of change of capacitance C1 of the first sensor electrode 81 or the rate of change of capacitance C3 of the third sensor electrode 83 may have a negative value.

Thus, the start electrode determination unit 91 determines that a user's operation has been performed in a case where the rate of change of the capacitance of a sensor electrode subject to the start electrode determination is greater than or equal to a specific rate determination value. In contrast, the start electrode determination unit 91 determines that a user's operation has not been performed in a case where the rate of change of the capacitance of the sensor electrode subject to the start electrode determination is less than the specific rate determination value. The specific rate determination value may be set to 0, or may be set to a value smaller than 0 on the basis of the influence of, for example, noise.

First Auxiliary Determination for Swipe Determination

When the user performs the swipe operation, the speed at which the user moves a hand tends to fall within a constant speed range. In other words, during the swipe determination, the time during which the capacitance of the adjacent electrode becomes greater than or equal to the second determination value C2Th and then the capacitance of the operation end electrode becomes greater than or equal to the third determination value C3Th tends to fall within a constant time range. In contrast, in the case of precipitation, during the swipe determination, the time during which the capacitance of the adjacent electrode becomes greater than or equal to the second determination value C2Th and then the capacitance of the operation end electrode becomes greater than or equal to the third determination value C3Th may be extremely advanced or may be extremely retarded.

Thus, during the swipe determination, the operation determination unit 92 determines that a user's operation has been performed in a case where the time during which the capacitance of the adjacent electrode becomes greater than or equal to the second determination value C2Th and then the capacitance of the operation end electrode becomes greater than or equal to the third determination value C3Th falls within a specific time range. In contrast, during the swipe determination, the operation determination unit 92 determines that a user's operation has not been performed in a case where the time during which the capacitance of the adjacent electrode becomes greater than or equal to the second determination value C2Th and then the capacitance of the operation end electrode becomes greater than or equal to the third determination value C3Th does not fall within the specific time range.

Second Auxiliary Determination for Swipe Determination

In a case where the user performs the swipe operation, at the point in time when the user ends the swipe operation, a hand of the user is closest to the operation end electrode while the hand is separated from the operation start electrode and the adjacent electrode. Thus, the capacitance of the operation end electrode becomes greater than the capacitance of the operation start electrode and the capacitance of the adjacent electrode at the point in time when the swipe operation is defined, for example, at the point in time when an affirmative determination is made in step S22 in FIG. 4. In contrast, during precipitation, the capacitance of the operation end electrode does not always become greater than the capacitance of the operation start electrode and the capacitance of the adjacent electrode at the point in time when the swipe operation is defined.

Thus, the operation determination unit 92 determines that a user's operation has been performed when the capacitance of the operation end electrode is greater than the capacitance of the operation start electrode and the capacitance of the adjacent electrode at the point in time when the swipe operation is defined in the swipe operation. In contrast, the operation determination unit 92 determines that a user's operation has not been performed when the capacitance of the operation end electrode is less than at least one of the capacitance of the operation start electrode and the capacitance of the adjacent electrode at the point in time when the swipe operation is defined in the swipe operation.

Third Auxiliary Determination for Swipe Determination

When the user performs the swipe operation, capacitances C1 to C4 of the sensor electrodes 81 to 84 do not easily have a negative value. In contrast, as described above regarding the fifth auxiliary determination for the hand-holding determination, the execution of calibration for the sensor electrodes 81 to 84 may cause capacitances C1 to C4 of the sensor electrodes 81 to 84 to have a negative value during precipitation.

Thus, during the swipe determination, the operation determination unit 92 determines that a user's operation has been performed in a case where capacitances C1 to C3 of the sensor electrodes 81 to 83 are greater than or equal to a specific determination value. In contrast, during the swipe determination, the operation determination unit 92 determines that a user's operation has not been performed in a case where capacitances C1 to C3 of the sensor electrodes 81 to 83 are less than the specific determination value. The specific determination value may be set to 0, or may be set to a value smaller than 0 on the basis of the influence of, for example, noise. This determination can also be executed during the start electrode determination.

In the above-described auxiliary determinations, it is preferred that the determination values compared with various parameters be determined in advance from experiments and simulations.

In the second embodiment, when executing the hand-holding determination, the start electrode determination, and the swipe determination, the controller 85A executes auxiliary determinations. Thus, the additional execution of the auxiliary determinations allows the controller 85A to make various determinations with higher accuracy.

The above-described embodiment may be modified as follows. The above-described embodiment and the following modifications can be combined as long as the combined modifications remain technically consistent with each other.

In the operation detection devices 80, 80A, the first sensor electrode 81, the second sensor electrode 82, and the third sensor electrode 83 do not need to have the same size. In this case, it is preferred that the determination value used to determine the movement of the detection target toward each sensor electrode be set in correspondence with the size of the sensor electrode.

The operation detection devices 80, 80A may include only two sensor electrodes. In this case, when one of the sensor electrodes serves as the operation start electrode, the other one of the sensor electrodes serves as the adjacent electrode and the operation end electrode.

In the operation detection devices 80, 80A, four or more sensor electrodes may be arranged so as to form a row. In this case, it is preferred that the determination value used to determine whether the capacitance(s) of the sensor electrode(s) other than the operation start electrode, the adjacent electrode, and the operation end electrode be set appropriately. For example, that determination value simply needs to be equal to the first determination value C1Th.

In a case where one of the capacitances of the first sensor electrode 81 and the third sensor electrode 83 becomes greater than or equal to the first determination value C1Th, the start electrode determination unit 91 may set, to the operation start electrode, the sensor electrode of which the capacitance becomes greater than or equal to the first determination value C1Th. In other words, the first determination time Tx may be 0 seconds.

The operation detection devices 80, 80A may store, in advance, a map indicating the relationship between the capacitance of the adjacent electrode and the second determination value C2Th at the point in time when the operation start electrode is defined. In this case, the second determination value C2Th may change linearly or gradually in correspondence with the capacitance of the adjacent electrode at the point in time when the operation start electrode is defined.

The second determination value C2Th may be calculated by adding a variable offset value COff to the first determination value C1Th. In this case, it is preferred that the offset value COff be set to a variable value corresponding to the magnitude of the capacitance of the adjacent electrode at the point in time when the operation start electrode is defined.

The second determination value C2Th may be set to a fixed value. In this case, the second determination value C2Th is set to be greater than the first determination value C1Th.

In some sizes of the sensor electrode, an increase may occur in the capacitance of a sensor electrode serving as the operation end electrode as well as the capacitance of a sensor electrode serving as the adjacent electrode when the user moves a hand or the like toward the sensor electrode serving as the operation start electrode to perform the first operation or the second operation. Thus, the operation determination unit 92 may determine that the capacitance of the operation end electrode has increased when the capacitance of the operation end electrode becomes greater than or equal to the third determination value C3Th, which is greater than the first determination value C1Th. This allows the operation detection devices 80, 80A to detect an operation performed by the user more accurately. In this case, it is preferred that the processes corresponding to steps S14 to S16 in FIG. 4 be executed for the capacitance of the third sensor electrode 83 and the third determination value C3Th.

When a hand of the user is separated from the sensor electrode, the controllers 85, 85A may determine that the swipe operation or the hand-holding operation has been suspended. For example, the controllers 85, 85A simply need to determine that a hand of the user is separated from the sensor electrode when the rate of change of the capacitance of the sensor electrode has a negative value. In this case, steps S18 and S21 may be omitted in the flowchart shown in FIG. 4.

The vehicle door 30 does not have to be a sliding door. The vehicle door 30 may be a swing door or a back door. In either case, the directions in which the vehicle door 30 opens and closes simply need to correspond to the first direction D1 and the second direction D2. That is, the opening direction of the vehicle door 30 does not necessarily have to coincide with the first direction D1.

The opening-closing body is not limited to the vehicle door 30. The opening-closing body simply needs to be an opening-closing body that can be opened and closed, for example, a sunroof panel, a window glass, or a hood panel.

The controllers 85, 85A may be processing circuitry including one or more processors that operate according to a computer program (software), one or more dedicated hardware circuits (application specific integrated circuits: ASIC) that execute at least part of various processes, or a combination thereof. The processor includes a CPU and memory such as a RAM and a ROM. The memory stores program codes or commands configured to cause the CPU to execute processes. The memory, or a computer readable media, include any type of media that are accessible by general-purpose computers and dedicated computers.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

The invention claimed is:

1. A vehicle operation detection device, comprising:
sensor electrodes arranged so as to form a row and configured such that a capacitance of each of the sensor electrodes increases as a detection target approaches the respective sensor electrode; and
processing circuitry configured to output a command that causes an opening-closing body of a vehicle to open and close in reference to the capacitances of the sensor electrodes, wherein
an arrangement direction of the sensor electrodes includes a first direction corresponding to an opening direction of the opening-closing body and a second direction corresponding to a closing direction of the opening-closing body,
the sensor electrodes include two sensor electrodes at leading ends in the first direction and the second direction, respectively,
the processing circuitry is configured to execute:
a start electrode determination process that defines, as an operation start electrode, one of the two sensor electrodes having the capacitance greater than or equal to a first determination value;
an operation determination process that determines whether the capacitance of one of the sensor electrodes increases, the operation determination process determining that a first operation has been performed in a case where the one of the sensor electrodes having the increased capacitance is sequentially shifted in the first direction from the operation start electrode, the operation determination process determining that a second operation has been performed in a case where the one of the sensor electrodes having the increased capacitance is sequentially shifted in the second direction from the operation start electrode; and
a command process that outputs a first command that causes the opening-closing body to open based on the first operation being determined as having been performed and outputs a second command that causes the opening-closing body to close based on the second operation being determined as having been performed,
the sensor electrodes include an adjacent electrode that is adjacent to the operation start electrode, and
the operation determination process includes determining that a capacitance of the adjacent electrode has increased in a case where the capacitance of the adjacent electrode becomes greater than or equal to a second determination value, the second determination value being greater than the first determination value.

2. The vehicle operation detection device according to claim 1, wherein
the start electrode determination process includes defining, as the operation start electrode, one of the two sensor electrodes having the capacitance remaining greater than or equal to the first determination value over a determination time, and
the operation determination process includes calculating the second determination value in reference to a magnitude of the capacitance of the adjacent electrode at the point in time of defining the operation start electrode.

3. The vehicle operation detection device according to claim 2, wherein the operation determination process includes setting the second determination value to a value obtained by adding an offset value to the capacitance of the adjacent electrode at the point in time of defining the operation start electrode.

4. The vehicle operation detection device according to claim 1, wherein
the sensor electrodes include three sensor electrodes, the three sensor electrodes including the operation start electrode, the adjacent electrode, and an operation end electrode on an opposite side of the adjacent electrode from the operation start electrode, and
the operation determination process includes determining that the capacitance of the operation end electrode has increased in a case where the capacitance of the operation end electrode becomes greater than or equal to a third determination value, the third determination value being greater than the first determination value.

5. The vehicle operation detection device according to claim 1, wherein
an upper limit determination value is used to determine that the detection target is too close to one of the sensor electrodes, and
the operation determination process includes suspending the determination of whether the first operation or the second operation has been performed in a case where the capacitance of the one of the sensor electrodes becomes greater than or equal to the upper limit determination value.

6. A vehicle operation detection device, comprising:
sensor electrodes arranged so as to form a row and configured such that a capacitance of each of the sensor electrodes increases as a detection target approaches the respective sensor electrode; and
processing circuitry configured to output a command that causes an opening-closing body of a vehicle to open and close in reference to the capacitances of the sensor electrodes, wherein
an arrangement direction of the sensor electrodes includes a first direction corresponding to an opening direction of the opening-closing body and a second direction corresponding to a closing direction of the opening-closing body,
the sensor electrodes include two sensor electrodes at leading ends in the first direction and the second direction, respectively,
the processing circuitry is configured to execute:
a start electrode determination process that defines, as an operation start electrode, one of the two sensor electrodes having the capacitance greater than or equal to a first determination value;
an operation determination process that determines whether the capacitance of one of the sensor electrodes increases, the operation determination process determining that a first operation has been performed in a case where the one of the sensor electrodes having the increased capacitance is sequentially shifted in the first direction from the operation start electrode, the operation determination process determining that a second operation has been performed in a case where the one of the sensor electrodes having the increased capacitance is sequentially shifted in the second direction from the operation start electrode; and
a command process that outputs a first command that causes the opening-closing body to open based on the first operation being determined as having been performed and outputs a second command that causes the opening-closing body to close based on the second operation being determined as having been performed,
the sensor electrodes include an adjacent electrode that is adjacent to the operation start electrode,
the operation determination process includes determining that a capacitance of the adjacent electrode has increased in a case where the capacitance of the adjacent electrode becomes greater than or equal to a second determination value,
the start electrode determination process includes defining, as the operation start electrode, one of the two sensor electrodes having the capacitance remaining greater than or equal to the first determination value over a determination time, and the operation determination process includes setting the second determination value to be greater than the first determination value in a case where the capacitance of the adjacent electrode at a point in time of defining the operation start electrode is greater than or equal to the first determination value and setting the second determination value to be equal to the first determination value in a case where the capacitance of the adjacent electrode at the point in time of defining the operation start electrode is less than the first determination value.

7. The vehicle operation detection device according to claim 6, wherein the operation determination process includes calculating the second determination value in reference to a magnitude of the capacitance of the adjacent electrode at the point in time of defining the operation start electrode in a case where the capacitance of the adjacent electrode at the point in time of defining the operation start electrode is greater than or equal to the first determination value.

8. The vehicle operation detection device according to claim 7, wherein the operation determination process includes setting the second determination value to a value obtained by adding an offset value to the capacitance of the adjacent electrode at the point in time of defining the operation start electrode in a case where the capacitance of the adjacent electrode at the point in time of defining the operation start electrode is greater than or equal to the first determination value.

9. The vehicle operation detection device according to claim 6, wherein the sensor electrodes include three sensor electrodes, the three sensor electrodes including the operation start electrode, the adjacent electrode, and an operation end electrode on an opposite side of the adjacent electrode from the operation start electrode, and the operation determination process includes determining that the capacitance of the operation end electrode has increased in a case where the capacitance of the operation end electrode becomes greater than or equal to a third determination value, the third determination value being greater than the first determination value.

10. The vehicle operation detection device according to claim 6, wherein an upper limit determination value is used to determine that the detection target is too close to one of the sensor electrodes, and the operation determination process includes suspending the determination of whether the first operation or the second operation has been performed in a case where the capacitance of the one of the sensor electrodes becomes greater than or equal to the upper limit determination value.

11. A vehicle operation detection method for detecting an operation for causing an opening-closing body of a vehicle to open and close using sensor electrodes arranged so as to form a row, an arrangement direction of the sensor electrodes including a first direction corresponding to an opening direction of the opening-closing body and a second direction corresponding to a closing direction of the opening-closing body, the sensor electrodes including two sensor electrodes at leading ends in the first direction and the second direction, the vehicle operation detection method comprising:

defining, as an operation start electrode, one of the two sensor electrodes having the capacitance greater than or equal to a first determination value;

determining whether the capacitance of one of the sensor electrodes increases, the determining including determining that a first operation has been performed in a case where the one of the sensor electrodes having the increased capacitance is sequentially shifted in the first direction from the operation start electrode and determining that a second operation has been performed in a case where the one of the sensor electrodes having the increased capacitance is sequentially shifted in the second direction from the operation start electrode; and outputting a first command that causes the opening-closing body to open based on the first operation being determined as having been performed and outputting a second command that causes the opening-closing body to close based on the second operation being determined as having been performed, wherein the sensor electrodes include an adjacent electrode that is adjacent to the operation start electrode, and the determining whether the capacitance of the one of the sensor electrodes increases includes determining that a capacitance of the adjacent electrode has increased in a case where the capacitance of the adjacent electrode becomes greater than or equal to a second determination value, the second determination value being greater than the first determination value.

\* \* \* \* \*